United States Patent [19]

Taylor

[11] 4,053,876

[45] Oct. 11, 1977

[54] ALARM SYSTEM FOR WARNING OF UNBALANCE OR FAILURE OF ONE OR MORE PHASES OF A MULTI-PHASE HIGH-CURRENT LOAD

[75] Inventor: Douglas E. Taylor, Bridgeport, Conn.

[73] Assignee: Sidney Hoffman, Bridgeport, Conn.

[21] Appl. No.: 675,187

[22] Filed: Apr. 8, 1976

[51] Int. Cl.² ............................................. G08B 21/00
[52] U.S. Cl. .............................. 340/253 H; 361/185; 324/51; 340/253 A; 340/253 B; 340/255
[58] Field of Search ................ 340/248, 253, 255, 256; 317/27 R, 46, 47; 324/51, 86; 307/13

[56] References Cited

U.S. PATENT DOCUMENTS

| | | | |
|---|---|---|---|
| 2,759,177 | 8/1956 | Hightower | 340/253 C |
| 2,930,938 | 3/1960 | Tapper | 317/46 |
| 3,160,786 | 12/1964 | Faglie | 317/27 R |
| 3,300,650 | 1/1967 | Daien | 340/255 X |
| 3,536,957 | 10/1970 | Iverson et al. | 317/27 R |
| 3,579,217 | 5/1971 | Casey et al. | 340/253 A |
| 3,584,259 | 6/1971 | Traub et al. | 317/46 X |
| 3,699,431 | 10/1972 | Paddison et al. | 324/51 |
| 3,716,718 | 2/1973 | Nowell | 317/27 R X |
| 3,736,470 | 5/1973 | Ford et al. | 317/27 R |
| 3,783,341 | 1/1974 | Beckwith | 317/27 R |

Primary Examiner—John W. Caldwell
Assistant Examiner—Daniel Myer
Attorney, Agent, or Firm—Parmelee, Johnson & Bollinger

[57] ABSTRACT

An alarm system for warning of unbalance or failure of one or more phases of a multi-phase load circuit which is convenient and practical to use even where the load circuit is drawing a large current and where the flow of power to the load may be controlled by various devices, said alarm system including a three-phase resistance bridge circuit with a phantom neutral point at the common juncture of three similar resistances connected in a Y-pattern and each shunted across a secondary winding of transformers having magnetic cores encircling the power leads to the load circuit and with the outer terminals of these resistors connected through resistance elements to the adjustable taps of three potentiometers included in the respective legs of a second Y pattern having the outer ends of these legs connected to the respective load phases for defining a second neutral point at their common junction. An unbalance sensing resistor is connected in circuit between the phantom neutral point and the second neutral point with an alarm circuit connected across said unbalance sensing resistance element. The alarm circuit includes adjustable amplifier means, time-delay means, adjustable threshold responsive means, alarm means for giving a warning signal, operating means for the alarm means and actuating means connected to said operating means and controlled by said threshold means with a hysteresis feedback circuit for preventing fluctuation of said threshold responsive means after it has responded to an unbalance signal. The alarm circuit also provides warning if the input power fails in one or all phases due to a blown fuse or any other cause.

8 Claims, 4 Drawing Figures

ALARM SYSTEM FOR WARNING OF UNBALANCE OR FAILURE OF ONE OR MORE PHASES OF A MULTI-PHASE HIGH-CURRENT LOAD

FIELD OF THE INVENTION

The present invention is in the field of alarm systems for signalling when an electrical circuit fails. More particularly, this invention relates to an alarm system adapted for use with a multiple-phase electrical load which draws a high current and in which the load power is changed or intermittently turned on and off for control purposes, the alarm system being non-responsive to changes in load power produced by the control but giving an alarm if any one phase or all phases should fail. The invention can be used to advantage with three-phase high-current electrical loads having very nearly a unity power factor, such as three-phase electric furnaces.

BACKGROUND OF THE INVENTION

In three-phase electric furnaces the current drawn is very high, for example, of the order of one hundred amperes, and the temperature distribution within the furnace is often very critical. For instance, the furnace may be of substantial length and may be used for heat treating and sealing of large numbers of small electronic components, integrated circuit chips, and similar products, which are slowly conveyed through the length of the furnace. The various resistance heating elements being energized by the three-phase electrical power are located at spaced positions throughout the furnace. A temperature sensor such as a thermocouple may be used to control the temperature of the furnace, but it is usually not practical to attempt to monitor the temperature in the furnace at many different points along its length.

In the event that one of the electrical heaters should fail, the temperature distribution within the furnace will change significantly, but the temperature level in the vicinity of the sensor itself may remain at the proper level since the electrical resistance heaters in the other two phases are still being energized and the sensor may be located near an energized heater. Each heater may include a number of individual heater elements connected in series, and if any one of these individual elements should fail, the entire heater in that phase will fail. As a result of this change in temperature distribution, the products may become improperly heat treated. The operator does not have any way of learning that one of the electrical phases has failed, because the furnace remains hot, and the temperature sensor may continue to show that a proper temperature level is being maintained.

However, when the products are subsequently checked by quality control personnel, which may occur several hours or even a day or two later, it becomes apparent that the furnace has malfunctioned. By this time, several thousand dollars of product inventory may have become defectively heat treated. The problem of determining when one of the resistance elements in the furnace has failed is complicated by the high-current being drawn by the load and by the fact that the load is controlled, for example, by intermittently turning the whole load on and off.

U.S. Pat. No. 3,718,920 — Grenier shows a power control system for a polyphase power supply to the phase windings of an electric motor for giving an alarm signal if one of the phases should fail. However, this Grenier system involves the use of series resistors located in each of the three circuit legs with direct connections to opposite sides of each resistor for responding to the voltage drop thereacross. In the case of a high-current load, such as an electric furnace, it is not practical to put resistances in series with each of the heater elements because a large amount of electrical energy would be wasted by the $I^2R$ (current squared times resistance) losses occurring in such series resistances and because of the heat dissipation problems involved with this wastage of electrical power.

U.S. Pat. Nos. 3,636,541 to Genuit et al. and 3,525,019 to Lansch are in this general field and may be of interest to the reader.

SUMMARY OF THE INVENTION

The present invention provides a practical, convenient-to-use and economical solution to the above problems and with the alarm system described as a presently preferred embodiment of the invention, the following advantages are obtained:

1. A slight increase or decrease in the current flowing in one phase of a three-phase circuit relative to the other phases is detected and audible and/or visual alarm signals are immediately given.
2. A slight increase or decrease in the current flowing in one phase of a three-phase circuit relative to the other phases is detected without inserting lossy elements in series with the load.
3. Gross changes in the current flow in any one phase relative to the others is also detected.
4. The installation is convenient and easy to accomplish for the standard terminating arrangements of the three-phase electric load, such as a furnace, can be used with conventional electrical cabling being use. In other words, special terminal arrangements or complex series-resistance connections are not required.
5. The illustrative alarm system can be used where very high current flows to the load are involved, for example, of the order of hundreds of amperes, and can be used with resistive loads or any other loads having a power factor close to unity.
6. In the event that the incoming power fails in one or in all phases due to a blown fuse or tripped cirucit breaker, an alarm is also given so that the system is fail safe.
7. The alarm system does not give an alarm when the load control turns the power on and off and does not give an alarm even though the load control may turn the power on or off in one of the phases slightly sooner or later than in the other phases. Thus, the alarm is not triggered by uneven opening or closing of the contactors used for controlling the input of electrical power to the load nor by other unbalance transients in the load circuit.
8. A fail-safe alarm system is provided.

In the alarm system, as described, a phantom neutral point is established in a three-phase balance sensing bridge circuit by using three current transformers whose outputs are each shunted by resistors which are connected in a Y pattern and which are balanced against a second Y pattern of resistors and potentiometers having a second neutral point. The phantom neutral point and the second neutral point are interconnected through a sensing resistor of relatively large resistance value such that any unbalance in the currents flowing in any one of the phases causes an unbalance current to pass through the sensing resistor thereby providing a voltage input into the alarm circuit. The alarm circuit is fail safe in operation for it also responds to an interruption of the input power being supplied to any one or all of the phases.

The objects, advantages and features of the present invention will become more fully understood from the accompanying detailed description and drawings which are to be interpreted as exemplary and not in a limiting sense.

DETAILED DESCRIPTION OF PRESENTLY PREFERRED EMBODIMENT

Figure 1B:
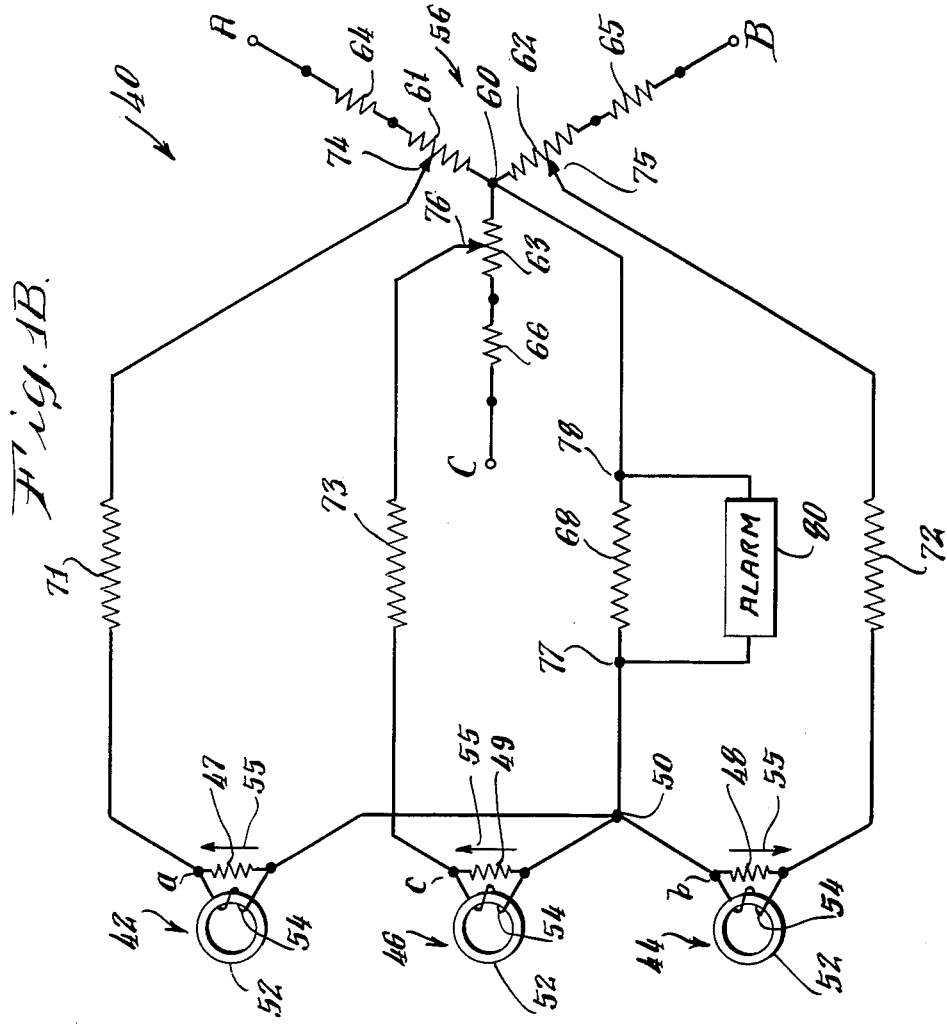
FIG. 1B is a schematic diagram of a three-phase balance sensing bridge circuit including a phantom neutral point established by three current transformers having their outputs each shunted by resistors connected in a Y pattern interconnected with resistors and potentiometers arranged in a second Y pattern and having a second neutral point.
Figure 1A:
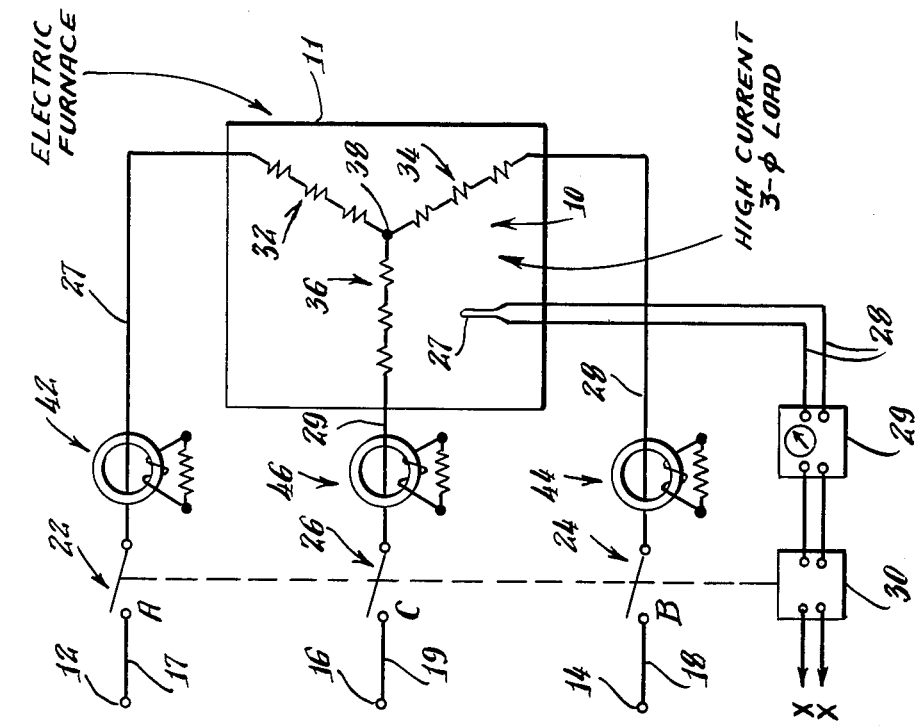
FIG. 1A is a schematic circuit diagram of a three-phase electrical load which draws a high current and in which the power input to the load is automatically controlled by the opening and closing of contactors. This type of electrical load is exemplary of those to which the alarm system of the present invention can be applied to advantage.

As shown in FIG. 1A, a high-current, threephase electrical load 10, such as the resistance heating elements in an electric furnace, is energized from the power line terminals 12, 14 and 16. Conventional cable leads 17, 18 and 19 can be used to connect these power terminals to the respective contactors 22, 24 and 26 which are used for controlling the power input to the load 10. To control the operation of the load 10, a temperature sensor 27, such as a thermocouple, is placed within the furnace 11 at an appropriate location. This thermocouple is connected by leads 28 to a temperature indicator and controller 29 which in turn is connected to an actuator 30 that opens and closes the contactors 22, 24 and 26. The actuator 30 is intended to open and to close the three contactors 22, 24 and 26 simultaneously, but in actual practice there may be a significant unevenness in the operation of these contactors which causes momentary unbalances in the current flow through the three phases of the load 10.

The load 10 includes resistances heaters 32, 34 and 36 which are connected by conventional cable leads 27, 28 and 29 to the respective contactors. The resistance heaters 32, 34 and 36 are connected in a Y pattern having a neutral point 38. These heaters may each include several individual resistance elements connected in series and positioned at various places within the furnace 11. If any one of the individual resistance elements fails or deteriorates, then one whole phase may fail or the current through it may diminish relative the other two phases with the result that the temperature distribution within the furnace 11 will change significantly, but the temperature level in the immediate vicinity of the sensor 27 may not change enough to be noticed on the indicator dial of the controller 29.

Although a Y-connected load circuit 10 is shown, it is to be understood that the alarm circuit of the present invention can also be employed with a delta-connected load circuit.

In order to sense any such unbalance current flow in the load 10, a three-phase bridge sensing network 40 (FIG. 1B) is provided including three identical current transformers 42, 44 and 46 each having their windings shunted by resistors 47, 48 and 49 connected together in a Y resistor pattern to form a phantom neutral point 50. These current transformers 42, 44 and 46 each include magnetically permeable cores 52 through which is passed the respective conventional cable lead 27, 28 or 29 as shown in FIG. 1A. The purpose of these cores is to define a closed magnetically permeable path encircling the power connection lead 27, 28 or 29. These cores 52 may be wound from strips of transformer iron to form an uninterrupted annulus, toroid, or oval, in which case the power leads 27, 28 and 29 are temporarily disconnected to be passed through the openings in the cores. Alternatively, the laminated cores 52 may be split mechanically or hinged together in two parts, so that they can be temporarily opened or separated to be snapped into place around the existing leads 27, 28 and 29. Regardless of what configuration of transformer core is used, the system is easy and convenient to install on an electric furnace since the conventional cable leads 27, 28 and 29 and their terminations are not changed.

Their secondary windings 54 are wound through the openings and include a sufficiently large number of turns to provide a voltage preferably of at least two volts or more across each of their relatively high resistance shunt resistors 47, 48 and 49 but the circuits as shown will operate satisfactorily with a somewhat lesser voltage thereacross. For clarity of illustration, these transformers 42, 44 and 46 are shown in both FIGS. 1A and 1B. The reason that a substantial voltage output is preferred is that such voltage level minimizes the effects of random electrical "noise" on the operation of the alarm system and more than four volts has been found to be optimum. Thus, these current transformers are unusual since they are wound with numerous secondary turns for producing an optimum voltage output of at least four volts across a shunt resistor.

The secondary windings 54 are arranged and connected so that they all have the same phase relationship, i.e. same sense of winding direction, with respect to the power leads 27, 28 and 29, as indicated by the arrows 55 in FIG. 1B.

A second Y resistance pattern 56 having three resistance legs joined at a common junction 60 is connected to the three-phase power lines as indicated by the terminal connection points labelled "A", "B" and "C". These connection points A, B and C may be attached to the live side of the contractors 22, 24 and 26 as indicated by the letters "A", "B" and "C" in FIG. 1A. Alternatively, the connection points A, B and C of the Y resistor pattern 56 can each be attached to the cold side of these contactors, whichever is more convenient in the particular installation that is involved. Any suitable electrical attachment means may be used. The Y resistor pattern 56 includes three similar potentiometers 61, 62 and 63 connected together at a second neutral point 60 and in series with the respective resistors 64, 65 and 66 forming the three resistance legs of the Y resistance pattern 56.

The three-phase phantom neutral bridge 40 is completed by connecting the second neutral point 60 through a resistor 68 of relatively large value and by connecting the opposite (outer) terminals "a", "b" and "c" of the resistors 47, 48 and 49 through resistors 71, 72 and 73 to the adjustable taps 74, 75 and 76 of the potentiometers 61, 62 and 63. The potentiometer taps 74, 75 and 76 are adjusted when the system is first put into operation to balance the circuit 40, so that a null exists across the sensing resistor 68 when a balanced three-phase current is flowing in the load circuit.

The reason for calling the point 50 at the junction of the Y connected resistance elements 47, 48 and 49 a phantom neutral point is that this point is floating with respect to the three phases of the load circuit 10 and the resistance elements 47, 48 and 49 themselves are also essentially floating with respect to the three phases of the load circuit, for the relatively large resistance elements 68, 71, 72 and 73 serve to isolate the resistance elements 47, 48 and 49 from the connection points A, B and C.

The fail-safe alarm circuit 80 (FIG. 2) is connected to the terminal points 77 and 78 at opposite sides of the unbalance sensing resistor 68. It is noted that the alarm circuit 80 has a common return circuit path 81 which is in floating voltage relationship relative to the earth, such that both of the input terminals 77 and 78 float and do not adversely affect the balance of the phantom neutral bridge 40 (FIG. 1B).

Figure 2:
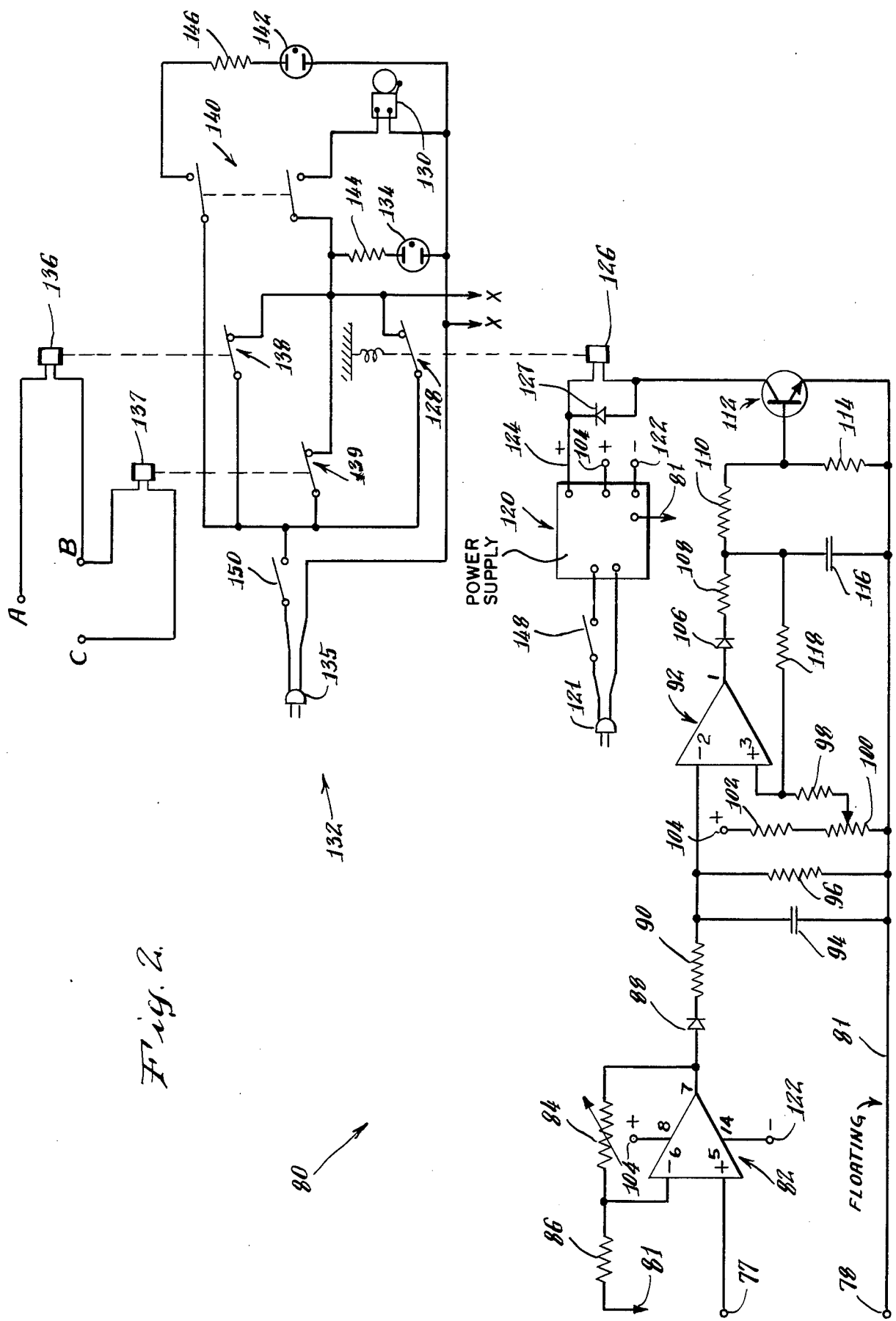
FIG. 2 is a schematic diagram of the fail-safe alarm circuit which is connected to three-phase bridge sensing circuit of FIG. 1B.

In the event that there is a slight increase or decrease or in case of a gross increase or decrease in the current flowing in one of the phases 32, 34 or 36 of the load 10, relative to that in the other phases, the alarm circuit 80 will give a warning signal for attracting the operator's attention. As shown in FIG. 2, the alarm circuit 80 includes an input terminal 77 connected to an operational amplifier (op. amp.) 82 which may comprise one-half of an N5558V chip that is available commercially from Signetics Corporation of Sunnyvale, California. The output of this op. amp. 82 is connected to its other input terminal through a negative feedback circuit including an adjustable resistor 84 and a shunt resistor to return 81. The op. amp. 82 is used as a high input impedance amplifier and the resistor 84 is used to adjust the overall sensitivity of the alarm circuit 80. Increasing resistance 84 increases the gain of the amplifier 82 and hence increases the sensitivity of the circuit 80.

The output of the op. amp. 82 is connected through a diode 88 and through a series resistor 90 into a second op. amp. 92 which may comprise the other half of the commercial unit described above. In order to filter out spurious noise signals and to provide rectified-current filtering and a time-delay in the response of the circuit 80, there is a capacitor 94 shunted to ground with a bleed resistor 96 across it. The capacitor 94 has a relatively large capacitance and in conjunction with the series resistor 90 provides the desired time-delay. This time-delay prevents the alarm 80 from responding to momentary or transient unbalancing of the circuit 40 (FIG. 1B) due to uneven opening or closing of the contactors 22, 24, 26 (FIG. 1A).

The op. amp. 92 has its positive input terminal connected through a resistor 98 to a reference voltage level provided by a potentiometer 100 in series with a resistor 102 connected to the positive power supply terminal 104. The output terminal of the op. amp. 92 is connected through a diode 106 and resistors 108 and 110 to the base of a transistor 112 having a resistor 114 connected to the return 81.

In order to provide hysteresis in the operation of the amplifier 92, for reasons to be discussed later, there is a capacitor 116 shunted to ground and a feedback path from the active side of this capacitor through a resistor 118 to the positive op. amp. terminal plus 3.

There is a power supply 120 which can be plugged into a conventional A.C. outlet by a plug 121 as shown. This power supply 120 has a positive supply terminal 104, for example, providing a +15 volts and a negative supply terminal 122, for example, providing −15 volts. This power supply also has another positive output terminal 124 which provides a more positive but less well filtered voltage than the terminal 104. This latter supply terminal 124 is connected through a relay winding 126 to the collector of the transistor 112. The power supply 120 may include a voltage step-down transformer and rectifier and filter circuits such as are well known in the art and hence its details are not shown.

The potentiometer 100 is used to set the threshold of the op. amp. 92. In initially adjusting the alarm circuit 80 for operation, the potentiometer 100 is adjusted to a level such that the op. amp. 92 is in a conducting state for placing the transistor 112 in a conducting state for passing current through the relay winding 126. The energized relay winding 126 holds its contacts 128 open, and thus the alarm circuit 80 is in a fail-safe condition.

Whenever the voltage at the inverted 2 input terminal of the op. amp. 92 rises about three millivolts above the voltage at the plus 3 input terminal, then the op. amp. 92 changes state and stops conduction, such that the relay winding 126 is deenergized, allowing the relay contacts 128 to close, thereby producing an alarm signal. The diode 127 shunting the relay winding 126 allows the relay to deenergize suddenly without transmitting a voltage surge into the transistor 112.

The hysteresis feedback circuits 108, 116, 118, 98 serve to separate the change of state point of the op. amp. 92 from its firing point, so as to prevent a fluctuating response. After the op. amp. 92 has changed state, the terminal plus 3 is pulled to a less positive voltage, thereby preventing the op. amp. from inadvertently changing back into its conducting state.

In adjusting the potentiometer 100, it is to be noted that the lower its tap is moved, the lower the threshold at which the op. amp. 92 will change state. In general, it is desirable to adjust the sensitivity resistor 84 to provide a relatively lower sensitivity and then to adjust the threshold potentiometer 100 to provide a low threshold (high sensitivity) so that the op. amp. 92 is readily triggered into its change of state. In typical operation, the voltage across the sensing resistor 68 (FIG. 1B) is approximately zero when the circuit 40 is balanced, but upon unbalance occurring the voltage at the terminal 77 may rise to several volts. When properly adjusted, even a slight change in the current flow in any one phase relative to the others causes an alarm signal to be given.

The alarm is provided by a ball or buzzer 130 in an alarm circuit 132, the bell being in parallel with a signal light 134 such as a neon lamp. Thus, both visual and audible alarms are given by the circuit 132 when the relay contacts 128 become closed. This alarm circuit 132 can be plugged into a conventional A.C. outlet by means of a plug 135 and includes a pair of relay windings 136 and 137 having the respective normally-closed relay contacts 138 and 139 which are connected in parallel with the relay contacts 128. The relay windings 136 and 137 have their terminals connected to the powerline sides of the contactors 22, 24 and 26 (FIG. 1A) as indicated by the letters "A", "B" and "C". Thus, as long as all three power leads 17, 18 and 19 are energized, the relay contacts 138 and 139 are held open.

Figure 3:
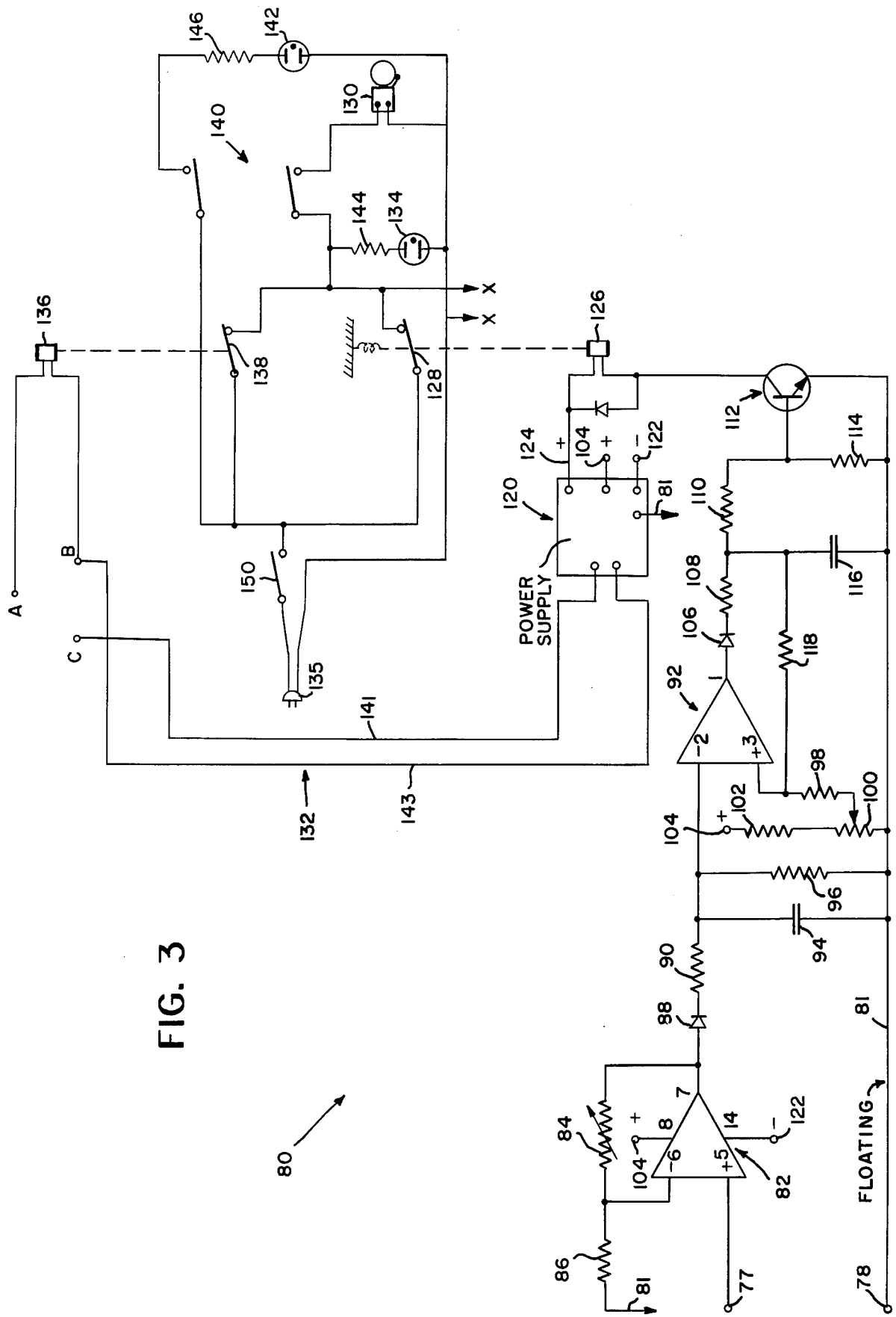
FIG. 3 is a schematic diagram similar to FIG. 2 and showing a modified circuit arrangement.

In the event a fuse becomes blown or a circuit breaker trips, then one or all three of the power leads 17, 18 and 19 become deenergized, thereby allowing closure of relay contacts 138, 139 or both, and thus giving an alarm. Accordingly, this fail-safe alarm circuit 80 also gives warning if for any reason the three-phase electrical power input to the furnace installation becomes interrupted in one or all phases. If desired, the power supply 120 can be used in lieu of one of the relays 136 or 137 to provide this power-failure alarm action. As shown in FIG. 3 by the connection lines 141, 143, the power supply 120 can be arranged to be energized by one of the phases, for example B-C, of the load circuit instead of by a plug as shown at 121 in FIG. 2. In the circuit arrangement of FIG. 3, the relay 137 and its contacts 139 can be omitted, for failure of that phase B-C will deenergize the power supply 120 thereby causing the relay contacts 128 to close to give an alarm signal.

The audible alarm 130 and lamp 134 will continue to give warning signals until the unbalance in the load 10 or until the failure of the three-phase power is corrected. Since it is tiring for an operator to continue listening to an audible alarm signal, there is a double-pole cutout toggle switch 140 which may be manually flipped to disconnect the audible alarm 130. This double-pole cutout switch 140 serves to energize a second visual alarm 142 whenever the audible alarm has been disconnected for reminding the operator that the audible alarm has been cut out.

Although neon lamps 134 are shown with current-limiting resistors 144 and 146 in series therewith, it is to be understood that any other type of signal lamps, such as incandescent lights can be used. Also, it is to be understood that instead of using A.C. plugs 121 and 135, and on-off switches 148 and 150, the power supply 120 and the alarm circuit 132 can be battery energized.

In the illustrative example, as shown, the following components with the following typical values work to advantage, all resistors are ¼ watt-dissipation rating, unless otherwise stated:

| Component | Value and Rating |
|---|---|
| R47, 48, 49 | *10,000 ohms |
| Pot. 61, 62, 63 | 1,000 ohms |
| R64, 65, 66 | 10,000 ohms, 2 watt |
| R71, 72, 73 | 2,700 ohms |
| R68 | 30,000 ohms |
| R84 | 0–10,000 ohms |
| R86 | 4,700 ohms |
| R90 | 2,000 ohms |
| R96 | 10,000 ohms |
| R98 | 10,000 ohms |
| Pot. 100 | 10,000 ohms |
| R102 | 1,500 ohms |
| R108 | 470 ohms |
| R110 | 3,900 ohms |
| R114 | 1,800 ohms |
| R118 | 470,000 ohms |
| C94 | 10 microfarads, 25 volts |
| C116 | 1 microfarad, 25 volts |
| Diode 88, 106, 127 | 1N914 |
| Op. Amp. 82 | ½ of N 5558V Signetics |
| Op. Amp. 92 | ½ of N 5558V Signetics |
| Transformers 42, 44, 46 | Preferably at least 2 volts and optimally more than 4 volts across R47, 48 and 49 |

*The value of these shunt resistors depends upon the transformer characteristics, -continued

| Component | Value and Rating |
|---|---| and they may be of a value in the range from approximately 50 ohms up to 10,000 ohms.

It is noted that the load 10 is controlled by on-off action of the contactors 22, 24 and 26. The alarm circuit of the present invention can also be used with other control means or other loads. For example, the control of electrical power to the load may be provided by mechanical contactors as shown, by saturable reactors, by silicon controlled rectifiers, or by triacs.

If desired, the alarm circuit 80 can be arranged for automatically shutting off the power to the load. To accomplish this automatic shut off, the two circuit connections x, x in FIG. 2 are extended to the actuator 30 (FIG. 1A) which is made responsive to the appearance of an electrical signal at its terminals x, x to shut off the power input to the load.

If the control means is unduly uneven in its control action with respect to the various phases of the load, such that unbalance transients of relatively long duration occur in the load, then the capacitor 94 and resistor 90 can both be increased in value to increase the time-constant. Also, the threshold adjustment can be increased by increasing the setting of the potentiometer 100, so that minor amounts of unbalancing of the load phases do not cause an alarm signal to be produced. For the three-phase phantom neutral point bridge 40 to become properly balanced with a null voltage across the sensing resistor 68, the load 10 should be essentially resistive in nature or should provide a power factor of very nearly unity, except during transient conditions.

I claim:

1. An alarm system for warning of unbalance or failure of one phase of a three-phase load circuit having three power leads running thereto and capable of being used with a high current flow in the load circuit comprising:

three similar magnetically permeable transformer cores each having an opening therein through which the perspective power lead is passed for defining a magnetically permeable path encircling each power lead, three similar secondary transformer windings, one of said windings being positioned on each of said cores and passing through the opening thereof, said secondary windings each having the same winding sense with respect to the power lead passing through the core on which the respective secondary winding is located, three similar resistors, one of said resistors being shunted across the terminals of each of said secondary windings, said three transformer shunt resistors being connected together at a common junction forming a first Y resistance pattern defining a phantom neutral point at their common junction.

a second Y resistance pattern having three similar resistance legs joined at a common junction defining a second neutral point, each of said resistance legs including a potentiometer having an adjustable tap thereon, means connecting the outer terminal of each of said resistance legs to a respective one of the phases of the load circuit, three similar resistance elements each connected in circuit between one of the outer terminals of said transformer shunt resistors and one of said adjustable taps, said resistance elements each being connected in circuit between the outer terminal of the secondary winding of the transformer which is associated with a particular phase of the load circuit and the tap of the potentiometer which is in the resistance leg that is connected to the same phase of the load circuit, an unbalance sensing resistance element connected in circuit between said phantom neutral point and said second neutral point, said potentiometers being adjustable for producing a null in voltage across said unbalance sensing resistance element when balanced three-phase current is flowing through the load circuit, and alarm circuit means including alarm means for producing a warning signal when a voltage appears across said unbalance sensing resistance element.

2. An alarm system as claimed in claim 1 in which:

said alarm circuit means includes amplifier means for amplifying the voltage appearing across said unbalance sensing resistance element, operating means connected to said alarm means for operating said alarm means to produce the warning signal, and adjustable threshold responsive means connected in circuit between said amplifier means and said operating means for actuating said operating means when the output of said amplifier means exceeds a predetermined threshold.

3. An alarm system as claimed in claim 2, in which:

said alarm circuit includes time-delay means in circuit between said amplifier means and said adjustable threshold means for preventing said adjustable threshold means for responding to momentary unbalance transients which may occur in the three-phase current flowing in the load circuit.

4. An alarm system as claimed in claim 2, in which:

a hysteresis feedback circuit is associated with said adjustable threshold responsive means for temporarily holding said responsive means in its responded condition after a response has occurred to prevent said responsive means from fluctuating between its initial and responded conditions.

5. An alarm system as claimed in claim 1, in which:

said alarm circuit means includes input power failure sensing means connected to the respective phases for sensing the interruption of electrical power input to one or all phases of the load circuit, said input power failure sensing means being connected in circuit with said alarm means for producing a warning signal in the event of such failure of electrical power input.

6. An alarm system as claimed in claim 5, in which:

said alarm circuit includes operating means for operating said alarm means, actuating means for causing said operating means to operate the alarm means upon de-energization of said actuating means, and circuit connection means connecting said actuating means to one of the phases of the power input lines for the load circuit for energizing said actuating means from said one phase, whereby said circuit connection means and said actuating means serve as input power failure sensing means for said one phase of the power input.

7. An alarm system as claimed in claim 1, in which:

said alarm circuit includes means for shutting off the flow of power to the load circuit when an unbalance voltage appears across said unbalance sensing resistance element.

8. An alarm system for warning of unbalance or failure of one phase of a three-phase load circuit having three power leads running thereto and capable of being used with a high current flow in the load circuit and in which power control means such as mechanical contactors, silicon controlled rectifiers, triacs and saturable reactors may be used to control the flow of electrical power into the load circuit comprising:

three similar magnetically permeable transformer cores each having an opening therein through which the perspective power lead is passed for defining a magnetically permeable path encircling each power lead, three similar secondary transformer windings, one of said windings being positioned on each of said cores and passing through the opening thereof, said secondary windings each having the same winding sense with respect to the power lead passing through the core on which the respective secondary winding is located, three similar resistors, one of said resistors being shunted across the terminals of each of said secondary windings, said three transformer shunt resistors being connected together at a common junction forming a first Y resistance pattern defining a phantom neutral point at their common junction, a second Y resistance pattern having three similar resistance legs joined at a common junction defining a second neutral point, each of said resistance legs including a potentiometer having an adjustable tap thereon, means connecting the outer terminal of each of said resistance legs to a respective one of the phases of the load circuit, three similar resistance elements each connected in circuit between one of the outer terminals of said transformer shunt resistors and one of said adjustable taps, said resistance elements each being connected in circuit between the outer terminal of the secondary winding of the transformer which is associated with a particular phase of the load circuit and the tap of the potentiometer which is in the resistance leg that is connected to the same phase of the load circuit, an unbalance sensing resistance element connected in circuit between said phantom neutral point and said second neutral point, said potentiometers being adjustable for producing a null in voltage across said unbalance sensing resistance element when balanced three-phase current is flowing through the load circuit, alarm circuit means including alarm means for producing a warning signal when a voltage appears across said unbalance sensing resistance element, and said alarm circuit means including time-delay means for rendering said alarm circuit unresponsive to transient voltages appearing across said unbalance sensing resistance element due to uneven operation of said control means.

* * * * *